(12) United States Patent
Chen et al.

(10) Patent No.: US 11,552,710 B2
(45) Date of Patent: Jan. 10, 2023

(54) RESISTIVITY ENGINEERED SUBSTRATE FOR RF COMMON-MODE SUPPRESSION

(71) Applicant: Acacia Communications, Inc., Maynard, MA (US)

(72) Inventors: Long Chen, Marlboro, NJ (US); Leonard Jan-Peter Ketelsen, Clinton, NJ (US)

(73) Assignee: ACACIA COMMUNICATIONS, INC., Maynard, MA (US)

( * ) Notice: Subject to any disclaimer, the term of this patent is extended or adjusted under 35 U.S.C. 154(b) by 0 days.

(21) Appl. No.: 16/995,732

(22) Filed: Aug. 17, 2020

(65) Prior Publication Data
US 2022/0052763 A1    Feb. 17, 2022

(51) Int. Cl.
*H04B 10/50*    (2013.01)
*H04B 10/032*    (2013.01)
*H04B 10/25*    (2013.01)
*H04J 14/02*    (2006.01)

(52) U.S. Cl.
CPC ........... *H04B 10/50* (2013.01); *H04B 10/032* (2013.01); *H04B 10/25* (2013.01); *H04J 14/0254* (2013.01)

(58) Field of Classification Search
None
See application file for complete search history.

(56) References Cited

U.S. PATENT DOCUMENTS

| 5,495,173 A | * | 2/1996 | Bockelman | G01R 1/06772 |
| | | | | 178/69 B |
| 5,811,874 A | * | 9/1998 | Lee | H01L 23/58 |
| | | | | 257/666 |
| 7,703,993 B1 | * | 4/2010 | Darbinyan | G02B 6/4232 |
| | | | | 385/92 |
| 8,053,335 B2 | * | 11/2011 | Yonehara | H01L 21/02639 |
| | | | | 438/459 |
| 9,372,381 B2 | | 6/2016 | Vermuelen et al. | |
| 9,405,073 B2 | | 8/2016 | Chen et al. | |

(Continued)

FOREIGN PATENT DOCUMENTS

EP    1357632    10/2003

OTHER PUBLICATIONS

Pasquariello entitled "Selective undercut etching of InGaAs and InGaAsP quantum wells for improved performance of long-wavelength optoelectronic devices", Journal of Lightwave Technology, vol. 24, No. 3, Mar. 2006, pp. 1470-1477 (Year: 2006).*

(Continued)

*Primary Examiner* — Darren E Wolf
(74) *Attorney, Agent, or Firm* — K&L Gates LLP (57) ABSTRACT

Aspects of the present disclosure are directed to a photonic integrated circuit (PIC) having a resistivity-engineered substrate to suppress radio-frequency (RF) common-mode signals. In some embodiments, a semiconductor substrate is provided that comprises two portions having different levels of resistivity to provide both suppression of common mode signals, and reduction of RF absorption loss for non-common mode RF signals. In such embodiments, a bottom portion of the semiconductor substrate has a low resistivity to suppress common mode via RF absorption, while a top portion of the semiconductor substrate that is adjacent to conductors in the IC has a high resistivity to reduce RF loss.

21 Claims, 5 Drawing Sheets

(56) References Cited

U.S. PATENT DOCUMENTS

| | | | |
|---|---|---|---|
| 9,477,039 B2 | 10/2016 | Doerr et al. | |
| 9,494,748 B2 | 11/2016 | Chen et al. | |
| 9,625,746 B2 | 4/2017 | Chen et al. | |
| 9,671,559 B2 | 6/2017 | Chen et al. | |
| 9,703,038 B1 | 7/2017 | Chen | |
| 9,726,840 B2 | 8/2017 | Chen | |
| 9,766,410 B1 | 9/2017 | Chen | |
| 9,829,659 B2 | 11/2017 | Chen et al. | |
| 9,922,887 B2 | 3/2018 | Vermeulen et al. | |
| 9,939,666 B2 | 4/2018 | Chen | |
| 9,977,269 B2 | 5/2018 | Chen | |
| 9,989,787 B2 | 6/2018 | Chen et al. | |
| 10,031,292 B2 | 7/2018 | Chen | |
| 10,088,733 B2 | 10/2018 | Doerr et al. | |
| 10,133,142 B2 | 11/2018 | Doerr et al. | |
| 10,203,453 B2 | 2/2019 | Chen | |
| 10,222,566 B1 | 3/2019 | Doerr et al. | |
| 10,241,268 B2 | 3/2019 | Chen et al. | |
| 10,284,300 B2 | 5/2019 | Doerr et al. | |
| 10,295,750 B2 | 5/2019 | Chen | |
| 10,416,380 B1 | 9/2019 | Chen et al. | |
| 10,852,472 B1* | 12/2020 | Ling | G02B 6/12004 |
| 2002/0074552 A1* | 6/2002 | Weeks, Jr. | H01L 33/04 |
| | | | 257/76 |
| 2004/0219765 A1* | 11/2004 | Reif | H01L 21/6835 |
| | | | 438/458 |
| 2004/0232412 A1* | 11/2004 | Burgener, II | H01S 5/327 |
| | | | 257/40 |
| 2007/0032040 A1 | 2/2007 | Lederer | |
| 2008/0102022 A1* | 5/2008 | Arakawa | C30B 11/00 |
| | | | 423/508 |
| 2009/0065051 A1* | 3/2009 | Chan | H01L 31/1892 |
| | | | 136/256 |
| 2010/0108133 A1* | 5/2010 | Bhagavatula | H01L 31/0543 |
| | | | 136/256 |
| 2012/0141799 A1* | 6/2012 | Kub | H01L 31/072 |
| | | | 428/408 |
| 2013/0000702 A1* | 1/2013 | Demirkan | H01L 31/0322 |
| | | | 136/252 |
| 2015/0198859 A1 | 7/2015 | Chen | |
| 2015/0212271 A1 | 7/2015 | Chen | |
| 2017/0059958 A1 | 3/2017 | Doerr et al. | |
| 2017/0139305 A1 | 5/2017 | Chen | |
| 2018/0003899 A1 | 1/2018 | Doerr et al. | |
| 2018/0041282 A1 | 2/2018 | Chen et al. | |
| 2018/0175113 A1* | 6/2018 | Furuya | H01L 21/486 |
| 2019/0171084 A1 | 6/2019 | Parker et al. | |
| 2019/0285815 A1* | 9/2019 | Sugiyama | H04B 10/801 |
| 2019/0324345 A1* | 10/2019 | Vera Villarroel | G02F 1/2257 |

OTHER PUBLICATIONS

Jones, Diffusion in Silicon, IC Knowledge LLC. 2000; 71 pages.
Weiming Yao, et al.; "Expermental and Numerical Study of Electrical Crosstalk in Photonic-Integrated Circuits"; Journal of Lightwave Technology; vol. 33; No. 4; (2015); (9 pages).
PCT International Search Report and PCT Written Opinion for PCT International Patent Application No. PCT/US2021/046085; dated Dec. 2, 2021; (16 pages).

\* cited by examiner

RESISTIVITY ENGINEERED SUBSTRATE FOR RF COMMON-MODE SUPPRESSION

BACKGROUND

Field

The present application relates to photonic integrated circuits.

Related Art

A photonic integrated circuit (PIC) is a device often used in optical communications and other systems. A PIC typically includes one or more photonic components for transmission and processing of optical signals, as well as electronic integrated circuits for transmission and processing of electric signals.

SUMMARY

Aspects of the present disclosure are directed to a photonic integrated circuit (PIC) having a resistivity-engineered substrate to suppress radio-frequency (RF) common-mode signals. In some embodiments, a semiconductor substrate is provided that comprises two portions having different levels of resistivity to provide both suppression of common mode signals, and reduction of RF absorption loss for non-common mode RF signals. In such embodiments, a bottom portion of the semiconductor substrate has a low resistivity to suppress common mode via RF absorption, while a top portion of the semiconductor substrate that is adjacent to conductors in the IC has a high resistivity to reduce RF loss.

In some embodiments, a photonic integrated circuit (PIC) is provided. The PIC comprises a semiconductor substrate comprising a top portion having a first resistivity and a bottom portion having a second resistivity lower than the first resistivity. The top portion and bottom portion are arranged along a vertical direction normal to a surface of the semiconductor substrate. The PIC further comprises a conductor disposed above the top portion of the semiconductor substrate and extending in a plane parallel to the surface; and a photonic component disposed on the semiconductor substrate and coupled to the conductor.

In some embodiments, a method to fabricate a photonic device is provided. The method comprises forming a conductor and a photonic component on a first semiconductor layer; providing a second semiconductor layer underneath the first semiconductor layer. The second semiconductor layer has a resistivity of less than 50 ohm·cm. At least a portion of the first semiconductor layer in between the conductor and the second semiconductor layer has a resistivity of more than 50 ohm·cm.

BRIEF DESCRIPTION OF DRAWINGS

Various aspects and embodiments of the disclosure will be described with reference to the following figures. It should be appreciated that the figures are not necessarily drawn to scale. Items appearing in multiple figures are indicated by the same reference number in all the figures in which they appear. For purposes of clarity, not every component may be labeled in every drawing.

DETAILED DESCRIPTION

Aspects of the present disclosure are directed to a photonic integrated circuit (PIC) having a resistivity-engineered substrate to suppress radio-frequency (RF) common-mode signals.

Some photonic devices include an integrated circuit (IC) fabricated on a semiconductor substrate for processing and transmission of RF signals. The IC may have conductors that are configured as transmission lines to route high frequency RF signals, for example from RF launch points to and from photonic components in the PIC. The conductors may be coupled to one or more photonic components disposed on the semiconductor substrate. In some embodiments, the conductors are disposed above one surface or a top surface of the semiconductor substrate, while an opposed surface or a bottom surface of the semiconductor substrate has an electric potential, for example from a conductive plane such as a power or ground plane.

The conductors may route RF signals in either single-ended or differential configuration. In addition, a common mode RF signal transmission may be supported between conductors above the top surface of the semiconductor substrate and the bottom surface of the semiconductor substrate.

Some aspects of the present disclosure are directed to suppression of common mode signal transmission in the conductors. The inventors have recognized and appreciated that such a common mode transmission is undesirable for at least several reasons. Firstly, as the distance between the conductors to the bottom surface of the semiconductor substrate can be large, such as a few hundred micrometers, the common mode is weakly confined to a particular conductor and can induce significant RF crosstalk between neighboring conductors and devices on the semiconductor substrate. Secondly, the conductors and power/ground planes could have common mode resonances that can degrade performance of the IC, such as degrading RF crosstalk performance. One aspect of the present disclosure provides suppression of the common mode by increasing RF loss. In some embodiments, a portion of the semiconductor substrate has a low resistivity of less than 50 ohm·cm, less than 20 ohm·cm, less than 10 ohm·cm, or between 1 and 10 ohm·cm. Because all the electric field lines associated with common mode transmission go through the portion of the semiconductor substrate, a low resistivity can induce current and RF propagation loss due to absorption, such that common mode signals are suppressed.

Yet another aspect of the present disclosure is directed to avoiding or reducing RF propagation loss to desirable RF signals carried in the conductors. When electric field lines associated with the desired RF signal modes penetrate through a portion of a semiconductor substrate, the field lines induce current which in turn induces undesirable absorption loss to the RF signal. As a result, the resistivity of the portion of semiconductor substrate may have a significant impact on the RF characteristics of signal transmission in the conductors. The substrate absorption effect may become more pronounced when a surface of the semiconductor substrate is close to the electrode above the semiconductor substrate, such as a distance of 10 μm or less.

In some embodiments, a semiconductor substrate is provided that comprises two portions having different levels of resistivity to provide both suppression of common mode signals, and reduction of RF absorption loss for non-common mode RF signals. In such embodiments, a bottom portion of the semiconductor substrate has a low resistivity to suppress common mode via RF absorption, while a top portion of the semiconductor substrate that is adjacent to conductors in the IC has a high resistivity to reduce RF loss. The resistivity of the top portion of the semiconductor substrate may be more than 50 ohm·cm, more than 100 ohm·cm, more than 500 ohm·cm, or between 100 and 500 ohm·cm. Such a semiconductor substrate that has a top portion having a high resistivity, and a bottom portion having a low resistivity may be referred to as a resistivity-engineered substrate.

Some aspects are directed to a method to fabricate a photonic device having a resistivity-engineered substrate. In some embodiments, a top semiconductor layer may be bonded or laminated to a bottom semiconductor layer using any suitable method to form a semiconductor substrate, with the top semiconductor having higher resistivity than the bottom semiconductor layer. In some other embodiments, the semiconductor substrate may be a unitary structure such as part of a semiconductor wafer, with a top portion and bottom portion bearing different resistivity levels through doping.

In some embodiments, one or more photonic components and conductors may be formed on the top semiconductor layer. Formation of photonic components and conductors may be prior to or subsequent to formation of the resistivity-engineered substrate. It should be appreciated that there is no requirement that the top semiconductor layer have a uniformly high resistivity across an entire lateral extent and in some embodiments, the top semiconductor layer may have heterogeneous spatial distribution of resistivities, with high resistivity portions provided in regions adjacent the conductors to reduce RF signal loss.

The aspects and embodiments described above, as well as additional aspects and embodiments, are described further below. These aspects and/or embodiments may be used individually, all together, or in any combination of two or more, as the disclosure is not limited in this respect.

Figure 1:
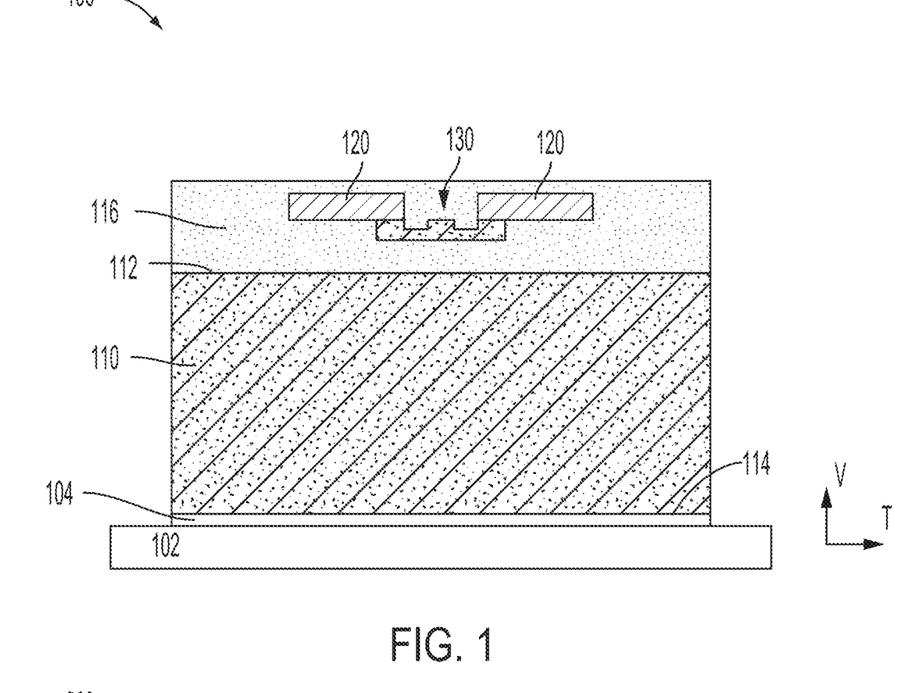
FIG. 1 is a schematic side-view diagram showing components of a PIC without a resistivity-engineered substrate.

FIG. 1 is a schematic side-view diagram showing components of a PIC 100 without a resistivity-engineered substrate. PIC 100 includes conductors 120 and a photonic component 130, a dielectric layer 116, and a semiconductor substrate 110.

Dielectric layer 116 is disposed on a top surface 112 of semiconductor substrate 110, and may serve to provide electrical isolation, physical support and/or optical index matching or optical confinement for components within the dielectric layer. While FIG. 1 illustrates dielectric layer 116 as composed of a uniform material, it should be appreciated that dielectric layer 116 may comprise more than one material, including but not limited to an oxide, nitride, ceramic, polymer, and combinations thereof. Dielectric layer 116 may comprise more than one layer stacked over the vertical direction, and may be selectively patterned in the lateral direction. In some embodiments, dielectric layer 116 is a silicon oxide or silicon nitride layer deposited on the top surface 112 of semiconductor substrate 110.

Photonic component 130 may be a modulator, waveguide, splitter, combiner, optical amplifier, optical filter, emitter such as a laser, detector, or any other type of optical devices that can be integrated into a PIC. Photonic component 130 may be fabricated from any suitable materials, such as but not limited to a semiconductor, metal oxide, nitride, ceramic, carbon, polymer, and combinations thereof. In a non-limiting example, photonic component 130 is a silicon diode traveling waveguide modulator fabricated from a silicon-on-insulator (SOI) layer.

Semiconductor substrate 110 may comprise any suitable semiconductor material such as but not limited to silicon, germanium, SiGe, II-VI compound, III-V compound, and combinations thereof. In some embodiments, semiconductor substrate 110 may serve as a handle for physical support of components on the top surface 112. In the embodiments where dielectric layer 116 photonic component 130 is formed of an SOI layer, semiconductor substrate 110 may be a silicon substrate that is a handle for the SOI layer and the photonic component 130 is disposed on the top surface 112 of the silicon substrate 110.

Conductors 120 are coupled electrically to the photonic component 130, and may be planar conductors that extend in a longitudinal direction (not shown) that is perpendicular to the vertical (V) and transverse (T) directions, and disposed in a plane that is parallel to the longitudinal and lateral directions and above the top surface 112 of the semiconductor substrate 110. It should be appreciated that while two conductors 120 are shown, a PIC according to aspects of the present disclosure may have any number of conductors that are disposed in in one or more planes aligned with, below or above the conductors 120 that are configured as transmission lines to carry RF signals to and from photonic components in the PIC. Conductors 120 may be part of a conductive structure that further comprises interconnects, vertical via, pad or land for interconnecting with other conductive structures within the PIC. Conductors 120 may comprise any suitable conductive material such as but not limited to metal, metallic compounds as aspects of the present disclosure are not so limited.

Optionally and as shown in FIG. 1, PIC 100 further includes a second substrate 102 attached to the bottom surface 114 of the semiconductor substrate 110. Optionally and additionally, an interface material 104 such as a solder or epoxy is provided between the semiconductor substrate 110 and second substrate 102. Second substrate 102 may be a conductive base that include a ground or power plane that has an electric potential.

Conductors 120 and surrounding dielectric layer 116 may have material compositions and dimensions that are designed to support RF signals with a frequency of between 10 and 100 GHz. The RF signals may be carried in conductors 120 in single-ended transmission line, or in pairs of conductors 120 that are disposed laterally adjacent each other as differential mode signals. In some embodiments, conductors 120 may be configured as ground-signal-ground (GSG) transmission lines, with a single signal conductor carrying the RF signal and two ground conductors disposed alongside the signal conductor, although any suitable transmission line configuration may be used.

In some embodiments, conductor 120 may be close to the semiconductor substrate 110 which is conductive. For example, conductor 120 may be between 4 and 10 μm from the top surface 112 of the semiconductor substrate 110, and electric field lines associated with the RF signals carried in conductors 120 may penetrate at least a portion of semiconductor substrate 110 that is adjacent to, such as directly underneath the conductors 120. As a result, undesirable absorption loss to the RF signal may occur due to resistive loss in the portion of the semiconductor substrate 110.

Still referring to FIG. 1. A common mode RF signal transmission may be guided by electric fields between conductors 120 and an electric potential at the bottom surface 114 of the semiconductor substrate 110. The common mode is applicable for all conductors in the dielectric layer 116 that have conductive surfaces facing vertically toward the bottom surface 114 of the semiconductor substrate 110.

Figure 2A:
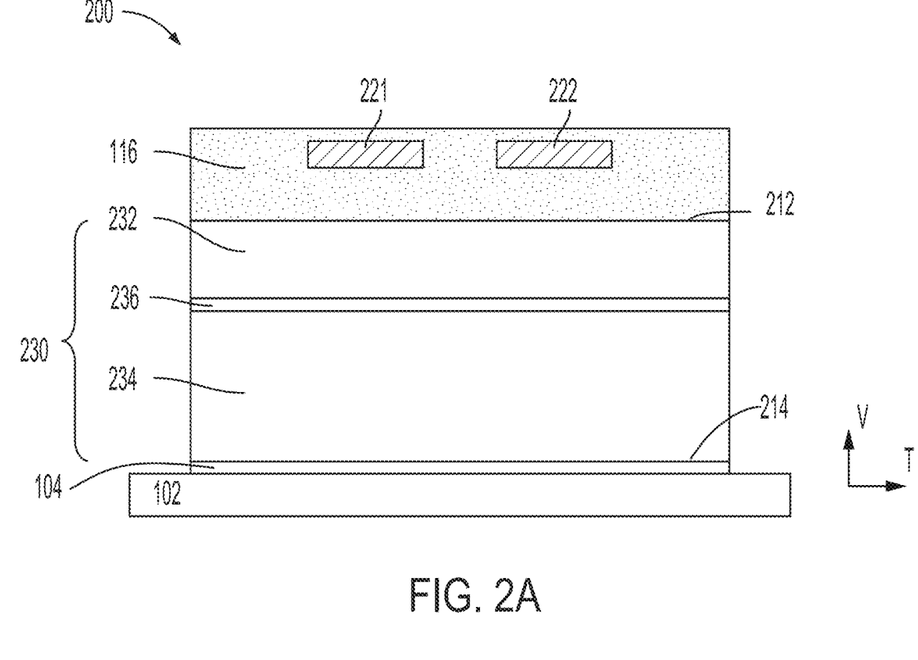
FIG. 2A is a schematic side-view diagram showing components of a PIC with a resistivity-engineered substrate, in accordance with some embodiments.

FIG. 2A is a schematic side-view diagram showing components of a PIC 200 with a resistivity-engineered substrate, in accordance with some embodiments. According to some aspects, the resistivity-engineered substrate design in PIC 200 may suppress common mode, while reducing RF loss to other modes of transmission in conductors 120.

In FIG. 2A, PIC 200 is similar to PIC 100 in FIG. 1 in some aspects, with like components represented by the same reference numbers. In PIC 200, conductors 221, 222 are disposed above a semiconductor substrate 230. While not shown, PIC 200 includes one or more photonic components on the semiconductor substrate 230.

Semiconductor substrate 230 comprises a top portion 232 and a bottom portion 234. The top portion 232 has a top surface 212 adjacent conductors 120, and has a higher resistivity than the bottom portion 234.

Figure 2B:
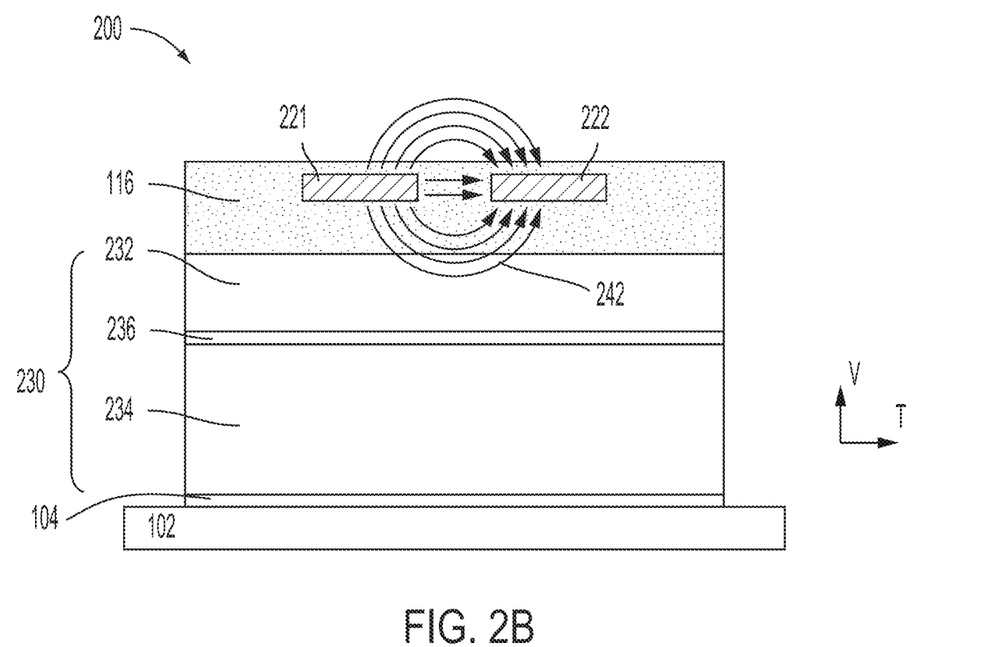
FIG. 2B is a schematic side-view diagram of the PIC in FIG. 2A illustrating electric field lines of a differential electrode pair.

FIG. 2B is a schematic side-view diagram of the PIC in FIG. 2A to illustrate electric field lines of a differential electrode pair. In FIG. 2B, conductors 221, 222 are configured as a differential electrode pair. Electric field lines 242 represent the electric field distribution of conductors 221, 222 in differential mode. While electric field lines 242 are localized to adjacent spaces and in between the pair of conductors 221, 222, some of the field lines penetrate through the top surface of the top portion 232 of the semiconductor substrate. Because a relatively high resistivity is used for the top portion 232, undesirable absorption loss to the differential RF signal carried by conductors 221, 222 as induced by the electric field lines 242 may be reduced. It should be appreciated from FIG. 2B that the lateral extent of the electric field line penetration into the top portion 232 does not span the entirety of the width of the PIC along the transverse direction. Therefore in some embodiments, top portion 232 may be a localized portion of a semiconductor layer that has high resistivity, and it is not required that an entire width of the top surface 212 of the semiconductor substrate 230 has a high resistivity to reduce RF loss.

Figure 3:
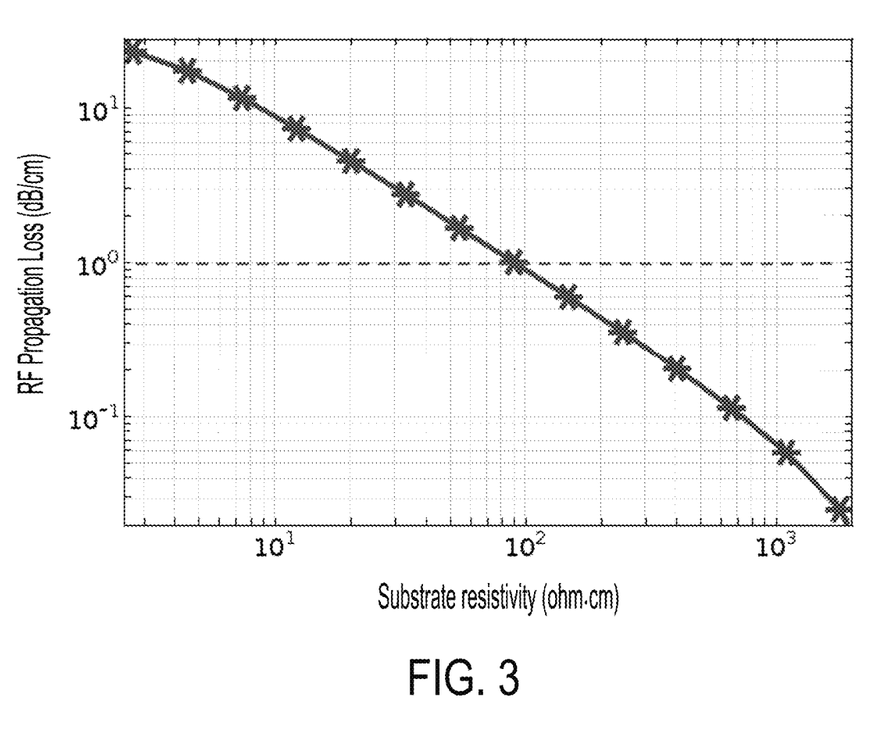
FIG. 3 is a simulated data plot illustrating RF propagation loss from substrate absorption as a function of substrate resistivity.

FIG. 3 is a simulated data plot illustrating RF propagation loss from substrate absorption as a function of substrate resistivity. In the example in FIG. 3, RF propagation loss at 30 GHz of a differential mode electrode pair is plotted as a function of a silicon substrate resistivity. FIG. 3 shows that at a substrate resistivity above about 9 ohms·cm, a propagation loss for the differential mode RF signal is less than 10 dB/cm. At a substrate resistivity above about 100 ohms·cm, a propagation loss for the differential mode RF signal is less than 1 dB/cm. At a substrate resistivity above about 500 ohms·cm, a propagation loss for the differential mode RF signal is less than 0.1 dB/cm.

Figure 2C:
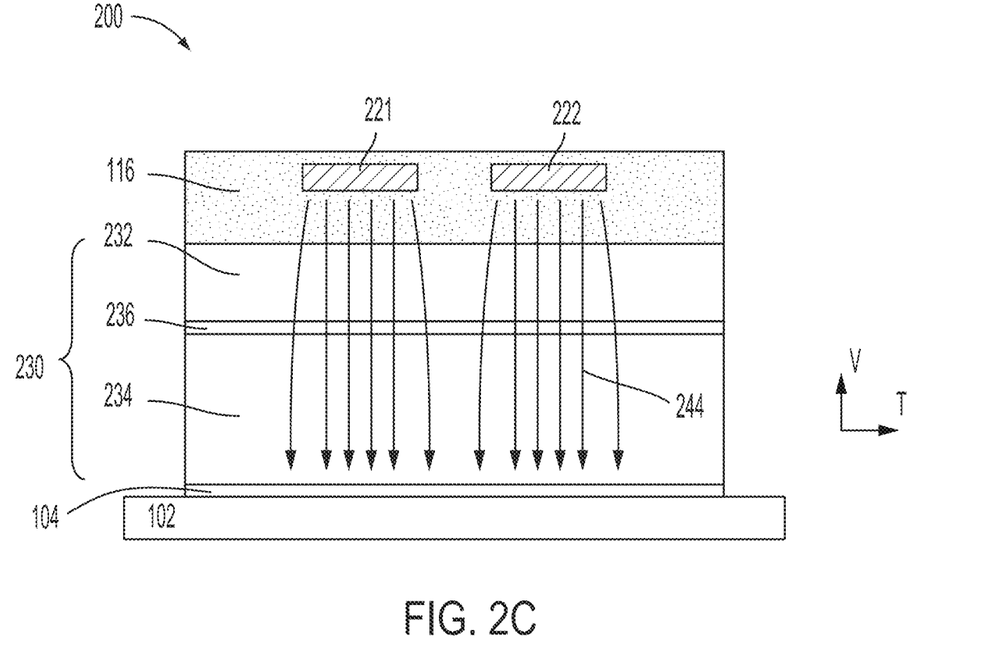
FIG. 2C is a schematic side-view diagram of the PIC in FIG. 2A illustrating electric field lines of a common mode signal.

FIG. 2C is a schematic side-view diagram of the PIC in FIG. 2A to illustrate electric field lines of a common mode signal. Electric field lines 244 represent the electric field distribution of a common mode signal between each of conductors 221, 222 and the bottom surface 114 of the semiconductor substrate 230. As shown in FIG. 2C, the distribution of electric field lines 244 is not localized to the vicinity of conductors 221, 222, but rather extends vertically through the semiconductor substrate 230, and is weakly confined in the transverse direction such that electric field lines that originate from conductor 221 may extend transversely to overlap with electric field lines originating from conductor 222, leading to RF crosstalk before neighboring conductors and devices.

Figure 4:
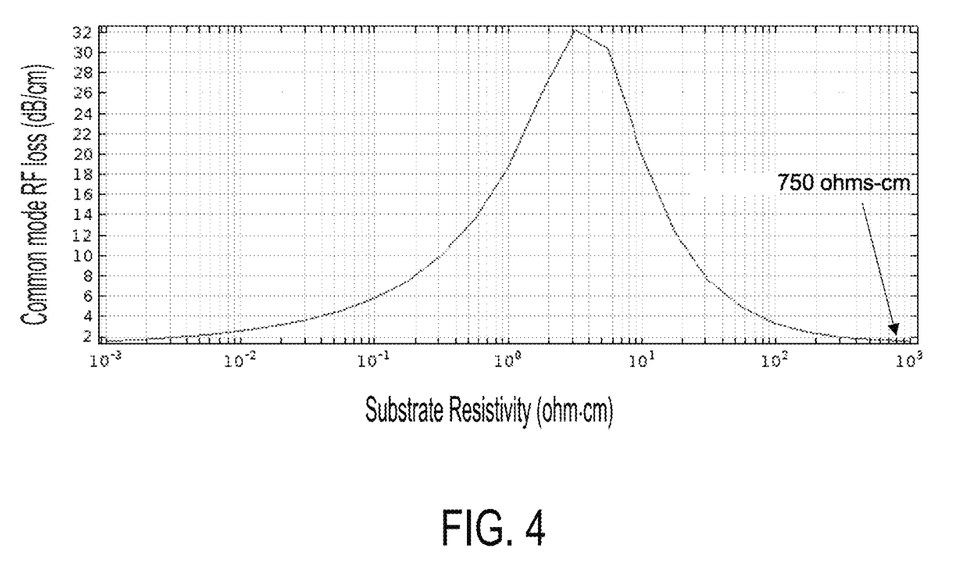
FIG. 4 is a simulated data plot illustrating common mode suppression loss from a substrate with low resistivity.

FIG. 4 is a simulated data plot illustrating common mode suppression loss from a substrate with low resistivity. In the example in FIG. 4, a silicon substrate is provided with a top portion of 200 μm thickness and a resistivity of 750 ohms·cm, while a bottom portion of 625 μm thickness is provided. The resistivity of the bottom portion is varied, and the plot in FIG. 4 shows the common mode RF loss as a function of the substrate resistivity of the bottom portion. The RF propagation loss for a common mode signal at 30 GHz has a peak at around 3 ohms·cm, where the RF propagation loss at the peak is about 16 times that of the baseline. In particular, FIG. 4 shows that a propagation loss for a common mode RF signal is at least 10 dB/cm for a substrate resistivity of between about 0.3 to about 20 ohms·cm.

Referring back to the diagram in FIG. 2A, the resistivity-engineered substrate such as semiconductor substrate 230 as disclosed herein has additional benefits compared to alternative methods. For example, while using conductive structures such as vias and/or shield plates that surround the conductors may provide suppression of common modes and reduction of crosstalk, it is not always practical in a photonic integrated circuit where there are photonic components occupying space in the dielectric layer and/or in the semiconductor substrate, making it difficult to provide shielding plates. As another example, to reduce substrate absorption loss, one alternative approach is to locally remove some of the semiconductor substrate under the differential mode electric field lines such as field lines 242 in FIG. 2B. However, such removal of semiconductor substrate material may adversely cause issues such as affecting mechanical support.

The inventors have recognized and appreciated that differential mode transmission, among other RF signal transmission schemes, are based on electromagnetic energy that is tightly localized around the conductors and is only affected by some portion of the semiconductor substrate while the common mode is affected by the entire depth of the semiconductor substrate. Therefore according to an aspect of the present disclosure, by providing a high resistivity top portion and a low resistivity bottom portion in a resistivity-engineered substrate such as semiconductor substrate 230, the two goals of supporting differential mode with minimum RF absorption and suppressing common mode with high RF absorption can be simultaneously met, even if the two goals have opposite requirements on the semiconductor substrate resistivity.

Still referring to FIG. 2A. In some embodiments, the top portion 232 may have a relatively high resistivity of more than 50 ohm·cm, more than 100 ohm·cm, more than 500 ohm·cm, or between 100 and 500 ohm·cm, with a thickness along the vertical direction in the range of 20 to 250 μm. The bottom portion 234 may have a relatively low resistivity of less than 50 ohm·cm, less than 20 ohm·cm, less than 10 ohm·cm, or between 1 and 10 ohm·cm, with a thickness along the vertical direction in the range of 200 to 1000 μm, or more than 1000 μm.

In a preferred embodiment, semiconductor substrate 230 is a silicon substrate and each of the top portion 232 and bottom portion 234 comprises silicon.

In FIG. 2A, top portion 232 and bottom portion 234 are separated by an interface material 236. Interface material 236 may be a dielectric material and may comprise an oxide such as silicon dioxide, a polymer such as Benzocyclobutene (BCB) or a non-conductive epoxy, although other suitable dielectric material may be used. Interface material 236 is optional and in some embodiments top portion 232 and bottom portion 234 may be directly coupled together without an interface material. In some embodiments, top portion 232 and bottom portion 234 may be differently doped regions of a same semiconductor substrate.

Figure 5A:
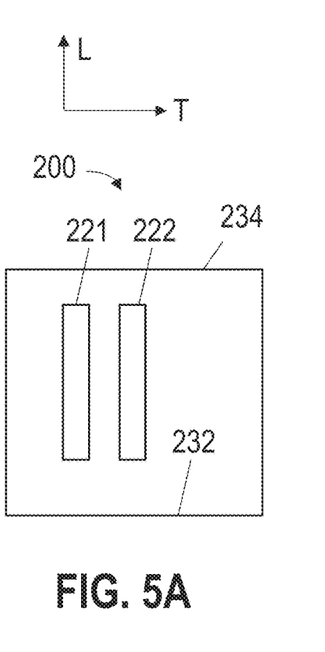
FIGS. 5A, 5B and 5C are schematic top-view diagrams of several variations of a PIC, in accordance with some embodiments.
Figure 5B:
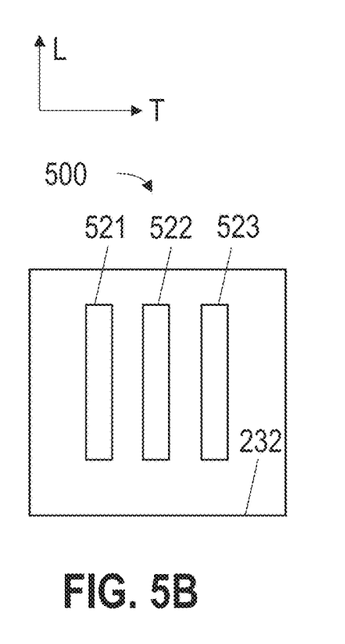
Figure 5C:
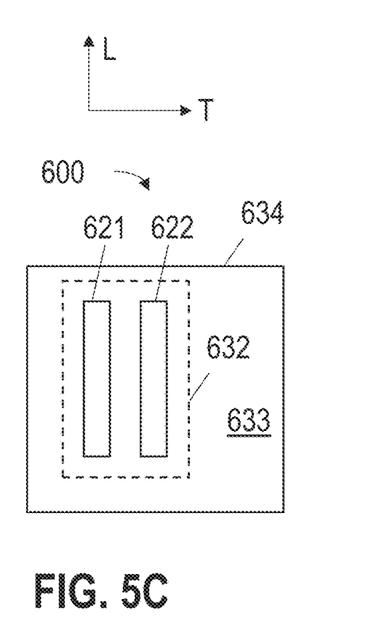

FIGS. 5A, 5B and 5C are schematic top-view diagrams of several variations of a PIC, in accordance with some embodiments. FIG. 5A shows a top view of PIC 200 as shown in FIG. 2A, with like components represented by the same reference numbers. In FIG. 5A, conductors 221, 222 extend along the longitudinal direction for carrying a differential mode RF signal. It should be appreciated that conductors 221, 222 may have any shape or dimension for transmitting RF signals, and the shape and size in FIG. 5A are simplified examples for illustrative purpose only. FIG. 5A may represent only a portion of PIC 200, and that more or less components may be present. In FIG. 5A, the high resistivity top portion 232 spans an entire lateral extent of the semiconductor substrate 230 along the transverse and the longitudinal direction, and has the same lateral extent with the bottom portion 234.

FIG. 5B shows a top-view diagram of a PIC 500 that is a variation of PIC 200 as shown in FIG. 5B, and shows conductors 521, 522 and 523 disposed above a top portion 232 of the semiconductor substrate 230. PIC 500 may include more than three conductors, and conductors may be disposed in different planes offset vertically from each other. Each of conductors 521, 522, 523 may be configured to carry a RF signal in any suitable fashion. In some embodiments, a pair of conductors may be configured as differential pair electrodes. In some other embodiments, conductors 521, 522, 523 may be configured as a GSG transmission line with the center conductor 522 carrying a single-ended RF signal.

FIG. 5C shows a top-view diagram of a PIC 600 that is another variation of PIC 200 as shown in FIG. 5B, and shows a local top portion 632 underneath conductors 621, 622. Top portion 632 is a localized region having high resistivity embedded in a layer 633, and is disposed between and immediately adjacent to the conductors 221, 222. Therefore the low resistivity bottom portion 634 has a maximum lateral extent that is wider than a maximum lateral extent of the high resistivity top portion 632 along the transverse or the longitudinal direction, or both directions. The boundary of local top portion 632 may be of any shape or size, and may be designed such that a substantially portion of the electric field lines between the differential electrodes that penetrate layer 633 are captured within the region of the portion 632 to reduce substrate absorption loss. Layer 633 outside of local top portion 632 may be of any suitable semiconductor material, and may have a resistivity that is lower than that of the local top portion 632.

A resistivity-engineered substrate according to aspects of the present disclosure may be fabricated in a number of different ways and at different stages of manufacture of a PIC.

For example and referring to FIG. 2A, top portion 232 and bottom portion 234 may be parts of a same semiconductor wafer, and each comprises a different doping level such that the top portion 232 has a high resistivity, while the bottom portion has a low resistivity. The doping may be performed at the beginning of the wafer manufacture process, such as during pulling of a silicon ingot prior to dicing into a wafer. In a non-limiting example, the top portion comprises a dopant having a concentration of less than $10^{14}$ cm$^{-3}$, and the bottom portion comprises a dopant having a concentration of more than $10^{15}$ cm$^{-3}$.

Alternatively, the semiconductor substrate 230 in FIG. 2A may be fabricated using a combination of components, such as for example by bonding two separate substrates of different resistivities. Each of the two separate substrates may be doped to have a desired resistivity level.

In a non-limiting example, the PIC 200 in FIG. 2A may be formed on an SOI wafer having a resistivity-engineered silicon substrate as handle. The resistivity-engineered silicon substrate may be fabricated by laminating a high resistivity handle wafer together with a low resistivity wafer using wafer bonding, such as but not limited to silicon-silicon bonding, oxide-mediated bonding, or any other suitable wafer bonding method.

In yet another non-limiting example, the resistivity-engineered semiconductor substrate 230 in the PIC 200 in FIG. 2A may be fabricated at a wafer level near the end of wafer fabrication process for the PIC. For example, a first semiconductor substrate may already have conductors and photonic components formed on the substrate's front side, and a back side of the first semiconductor substrate may be wafer-bonded to a second semiconductor substrate having lower resistivity to form the resistivity-engineered semiconductor substrate. The bonding may be any suitable wafer bonding method, such as but not limited to low temperature oxide bonding, adhesive wafer bonding, or performed at the die attach level by stacking two semiconductor dies together with a polymer adhesive in between the two dies.

Prior to bonding two substrates together in any of the exemplary processes described above, each of the two substrates may be grinded down to adjust its thickness, such that the thickness of the top portion 232, the bottom portion 234, and the overall semiconductor substrate 230 in FIG. 2A may be adjusted.

Having thus described several aspects of at least one embodiment of this technology, it is to be appreciated that various alterations, modifications, and improvements will readily occur to those skilled in the art.

Various aspects of the technology may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, aspects of the technology may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A photonic integrated circuit (PIC) comprising:
   a semiconductor substrate comprising a top portion having a first resistivity and a bottom portion having a second resistivity lower than the first resistivity, the top portion and bottom portion arranged along a vertical direction normal to a surface of the semiconductor substrate;
   a conductor disposed above the top portion of the semiconductor substrate and extending in a plane parallel to the surface; and
   a photonic component disposed on the semiconductor substrate and coupled to the conductor.

2. The PIC of claim 1, wherein:
   the conductor is a first conductor and the PIC further comprises a second conductor above the top portion of the semiconductor substrate and extending in the plane alongside the first conductor, wherein the first conductor and the second conductor are configured to transmit a differential mode RF signal at a frequency between 10 and 100 GHz.

3. The PIC of claim 2, wherein:
   a propagation loss for the differential mode RF signal in the first conductor is less than 10 dB/cm, and
   a propagation loss for a common mode RF signal in the first conductor is at least 10 dB/cm at a frequency between 10 and 100 GHz.

4. The PIC of claim 1, wherein the top portion has a resistivity of more than 50 ohm·cm, and the bottom portion has a resistivity of less than 50 ohm·cm.

5. The PIC of claim 4, wherein the top portion has a resistivity of more than 100 ohm·cm, and the bottom portion has a resistivity of less than 20 ohm·cm.

6. The PIC of claim 4, wherein the top portion has a resistivity of more than 500 ohm·cm and less than 2,000 ohm·cm, and the bottom portion has a resistivity of less than 10 ohm·cm.

7. The PIC of claim 1, wherein the top portion comprises a dopant having a concentration of less than $10^{14}$ cm$^{-3}$, and wherein the bottom portion comprises a dopant having a concentration of more than $10^{15}$ cm$^{-3}$.

8. The PIC of claim 1, wherein the top portion comprises silicon, and the bottom portion comprises silicon.

9. The PIC of claim 1, wherein the bottom portion has a maximum lateral extent that is wider than a maximum lateral extent of the top portion.

10. The PIC of claim 1, wherein the bottom portion has a maximum lateral extent that equals a maximum lateral extent of the top portion.

11. The PIC of claim 1, wherein the top portion has a thickness of between 20 and 250 µm, and the bottom portion has a thickness of between 200 and 1000 µm.

12. The PIC of claim 1, further comprising a conductive base coupled to the semiconductor substrate via the bottom portion.

13. The PIC of claim 1, further comprising a dielectric material disposed on the top portion, wherein the conductor is separated from the top portion by the dielectric material.

14. The PIC of claim 1, further comprising a first interface material disposed between the top portion and the bottom portion, wherein the first interface material has a thickness of less than 10 µm.

15. The PIC of claim 14, wherein the first interface material comprises an adhesive or solder.

16. The PIC of claim 1, wherein the photonic component is a diode modulator.

17. The PIC of claim 1,
    wherein the conductor is a first conductor and the PIC further comprises a second conductor above the top portion of the semiconductor substrate and extending in the plane alongside the first conductor,
    wherein the resistivity of the bottom portion is lower than the resistivity of the top portion, wherein the lateral extent of the bottom portion is wider than the lateral extent of the top portion, and
    wherein the resistivity of the top portion and the lateral extent of the top portion and the resistivity of the bottom portion and the lateral extent of the bottom portion causes both suppression of common mode signals, and reduction of RF absorption loss for non-common mode RF signals.

18. A method to fabricate a photonic device, comprising:
    forming a conductor and a photonic component on a first semiconductor substrate layer;
    providing a second semiconductor substrate layer underneath the first semiconductor substrate layer, the second semiconductor substrate layer having a resistivity of less than 50 ohm·cm,
    wherein at least a portion of the first semiconductor substrate layer in between the conductor and the second semiconductor substrate layer has a resistivity of more than 50 ohm·cm.

19. The method of claim 18, wherein the first semiconductor substrate layer is part of a first substrate, the second semiconductor substrate layer is part of a second substrate, and wherein providing the second semiconductor substrate layer underneath the first semiconductor substrate layer comprises:
    bonding the first substrate to the second substrate subsequent to forming the conductor and the photonic component on the first semiconductor substrate layer.

20. The method of claim 19, wherein bonding the first substrate to the second substrate comprises:

grinding a bottom side of the first substrate, such that a thickness of the first substrate is between 20 and 250 µm; and bonding the bottom side of the first substrate to the second substrate.

21. The method of claim 18, wherein the first semiconductor substrate layer and the second semiconductor substrate layer are part of a semiconductor wafer, and the method further comprises:

doping the first semiconductor substrate layer such that the first semiconductor substrate layer has a resistivity of less than 50 ohm·cm; and doping the second semiconductor substrate layer such that the second semiconductor substrate layer has a resistivity of more than 50 ohm·cm.

* * * * *